United States Patent [19]

Losee

[11] Patent Number: 4,525,733

[45] Date of Patent: Jun. 25, 1985

[54] PATTERNING METHOD FOR REDUCING HILLOCK DENSITY IN THIN METAL FILMS AND A STRUCTURE PRODUCED THEREBY

[75] Inventor: David L. Losee, Fairport, N.Y.

[73] Assignee: Eastman Kodak Company, Rochester, N.Y.

[21] Appl. No.: 354,422

[22] Filed: Mar. 3, 1982

[51] Int. Cl.³ .......................................... H01L 21/285
[52] U.S. Cl. ........................................ 357/65; 357/68; 357/6; 427/88; 427/89; 427/90; 427/93
[58] Field of Search ..................... 427/88, 93, 89-90; 357/65, 68, 6

[56] References Cited

U.S. PATENT DOCUMENTS

| | | | |
|---|---|---|---|
| 3,986,897 | 10/1976 | McMillan et al. | 148/627 |
| 4,012,756 | 3/1977 | Chaudhari et al. | 357/5 |
| 4,178,396 | 12/1979 | Okano | 427/93 |
| 4,291,068 | 9/1981 | Jones | 427/88 |
| 4,307,131 | 12/1981 | Moutou | 427/88 |

FOREIGN PATENT DOCUMENTS 1234544 6/1971 United Kingdom .

OTHER PUBLICATIONS

Journal of Applied Physics, 52(7), Jul. 1981, "Hillock-free Integrated Circuit Metallizations by Al/Al-O Layering" by T. J. Faith.
Journal Vacuum Science and Tech., 9(1), 515–519 (1972) "Hillock Growth on Vacuum Deposited Aluminum Films" by D. S. Herman, M. A. Schuster and R. M. Gerber.
Semiconductor International, Apr. 1982, p. 135, "Reduction of Hillock Formation in Aluminum Thin Films" by C. P. Lim.

Primary Examiner—John D. Smith
Attorney, Agent, or Firm—Thomas H. Close

[57] ABSTRACT

Hillock formation in a thin film of metal having a high coefficient of thermal expansion on a substrate having a low coefficient of thermal expansion is reduced by patterning the substrate in an area normally free from such pattern, specifically for the purpose of reducing hillocks, prior to formation of the thin metal film, with a bas-relief pattern of lands and valleys, having a depth dimension on the same order of magnitude as the thickness of the film.

8 Claims, 1 Drawing Figure

U.S. Patent    Jun. 25, 1985    4,525,733
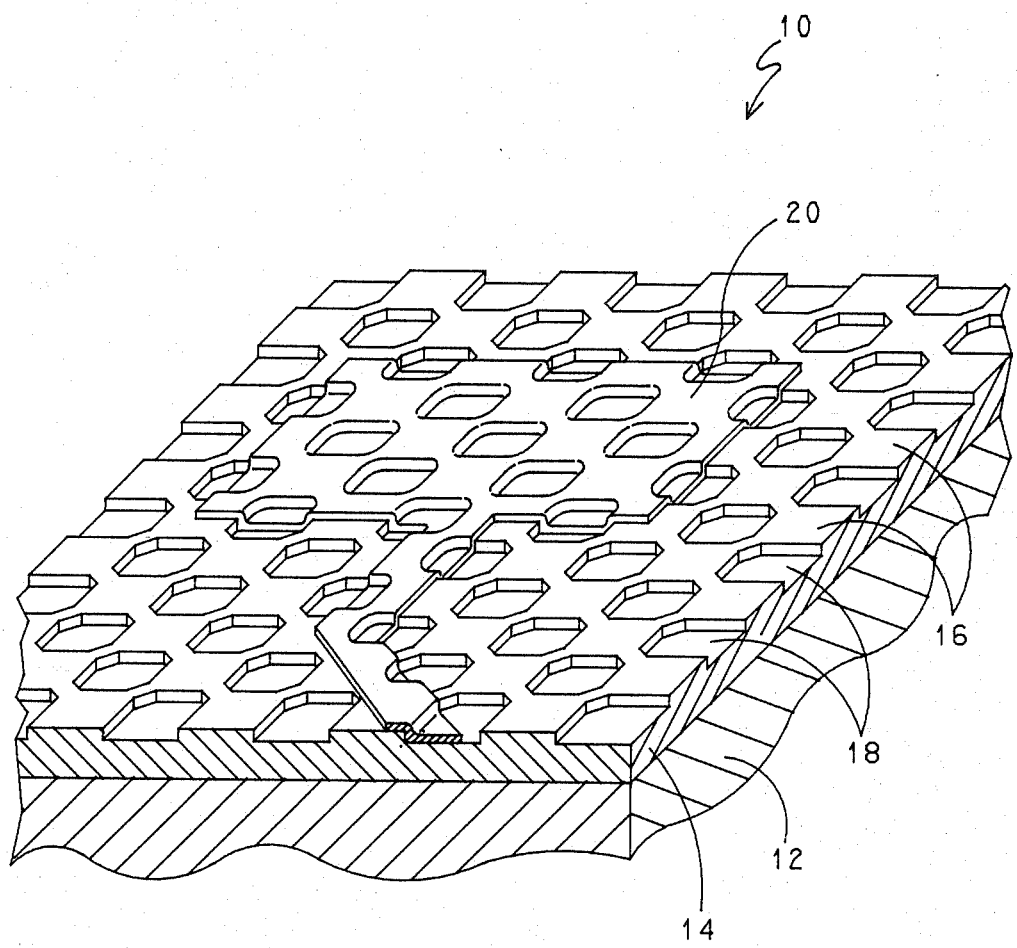

PATTERNING METHOD FOR REDUCING HILLOCK DENSITY IN THIN METAL FILMS AND A STRUCTURE PRODUCED THEREBY

BACKGROUND OF THE INVENTION

1. Field of the Invention

This invention relates to the manufacture of thin film devices, and more particularly to the reduction in the formation of hillocks in films of metal in such devices. Still more particularly, this invention relates to a method for reducing the formation of hillocks in aluminum layers in MOS devices and devices produced thereby.

2. Description of the Problem

When a thin metal film, particularly a soft metal such as aluminum with a high coefficient of thermal expansion, is deposited on a substrate with a low coefficient of thermal expansion, such as silicon, microscopic protrusions often appear in the surface of the film. Such protrusions commonly appear in the aluminum metallization layers deposited on oxidized silicon surfaces in the manufacture of integrated circuits. Protrusions appearing immediately after deposition of the aluminum film are termed "growth hillocks". The protrusions which develop after cycling the integrated circuit to a high-temperature during manufacturing steps are called "annealing hillocks".

In either case, these microscopic protrusions or hillocks are troublesome and can cause subsequent device failure. For example, hillocks can cause shorts between conductive layers in a device in areas where conductors cross over one another, or in elements of the device having two layers of conductor such as integrated capacitors. Hillocks can also cause device failure by causing gaps in the layers of photoresist applied to the device in patterning the metal layers. It is generally believed that hillocks form at metal grain boundaries as stresses caused by differences in thermal expansion coefficients between the metal film and the substrate are relieved during thermal cycling of the device.

Previous attempts to overcome the problem of hillock formation in thin metal films have included the addition of impurities such as silicon, copper, silver and gold to the aluminum to immobilize the grain boundaries in the metal film, see e.g. U.S. Pat. No. 4,012,756 issued Mar. 15, 1977 to Chaudhari et al. One suggested approach to reducing hillocks specifically in aluminum films is to treat the film to form a boehmite (AlO-OH) layer on its surface, see e.g. U.S. Pat. No. 3,986,897 issued Oct. 19, 1976 to McMillan et al.

Yet another recently disclosed approach to reducing hillocks in aluminum films is to alternate layers of aluminum and an aluminum oxygen alloy, by periodically introducing controlled bursts of oxygen into the aluminum deposition chamber. None of these above approaches has proven entirely satisfactory, however.

I have observed, during the manufacture of large scale integrated circuit devices, that in areas of the device where an aluminum film overlies a region of criss-crossing conductor lines that create a step-wise pattern of hills and valleys having a depth dimension of the same order of magnitude as the thickness of the film, hillock density (i.e. the number of hillocks per unit area) in the aluminum film is greatly reduced.

SUMMARY OF THE INVENTION

According to my invention, hillock formation in a thin film of metal having a high coefficient of thermal expansion on a substrate having a low coefficient of thermal expansion is reduced and novel structures are produced by deliberately patterning the substrate, in an area normally free from such pattern, for the purpose of reducing hillock density prior to the formation of the thin metal film, with a bas-relief pattern of lands and valleys, having a depth dimension of the same order of magnitude as the thickness of the film.

In a preferred embodiment of the invention, the substrate is silicon dioxide, the metal is aluminum about 1 $\mu$m thick, and the bas-relief pattern is a checkerboard pattern of 5 $\mu$m $\times$ 5 $\mu$m $\times$ 1 $\mu$m deep (high) squares.

BRIEF DESCRIPTION OF THE DRAWING

The single drawing is a partial perspective view showing a patterned thin metal film on a substrate, prepared according to the present invention to reduce the formation of hillocks in the film.

DESCRIPTION OF THE PREFERRED EMBODIMENT

In the preferred embodiment of the invention, the method of hillock reduction is employed in an MOS integrated circuit, which includes a type of transistor called a metal oxide semiconductor (MOS) field-effect transistor. The MOS integrated circuit is fabricated on a semiconductor substrate (e.g. p-type silicon). Side-by-side doped regions (e.g. n+-type silicon) created by standard masking and diffusion, or ion implantation techniques, in the surface of the substrate, form the source and drains of the field effect transistors. After forming the source and drain regions, a layer of insulating silicon oxide is grown over the surface of the silicon. Contact windows are opened in the oxide over the source and drain regions employing conventional photolithographic techniques, and a thin layer of aluminum is deposited on the surface of the device. The aluminum is patterned using well-known photolithographic techniques, to define contacts to the source and drain regions and the gate electrodes of the FET, electrical interconnection, and bonding pads.

In practice, a number of identical integrated circuits, each containing a plurality of field effect transistors is formed in a circular wafer of silicon, and the aluminum layer is applied to the entire wafer before patterning. The aluminum layers in such devices are known to be subject to both "growth" and "annealing hillocks".

According to the present invention a bas-relief pattern is formed in the substrate in areas normally free from such a pattern, prior to deposition of the aluminum, for the purpose of reducing hillocks in the aluminum. The bas-relief pattern comprises a pattern of lands and valleys having a depth dimension of the same order of magnitude as the thickness of the aluminum film.

The FIGURE is a greatly enlarged perspective view of a portion of an MOS device fabricated according to the present invention, showing a bonding pad of an integrated circuit. The MOS device 10 comprises a substrate 12 of doped single crystalline silicon. A layer of silicon dioxide $SiO_2$ approximately 1 $\mu$m thick is formed on the substrate. The silicon dioxide layer 14 is patterned with a checkerboard pattern of lands 16 and valleys 18. The lands and valleys are approximately 1 $\mu$m high (deep), and approximately 5 $\mu$m square. One method by which the device can be fabricated is as follows: First a 1 μm thick thermal oxide layer is grown on the silicon substrate by placing the substrate in a diffusion furnace at 1050° C. in a wet atmosphere for about 3 hours; next a 0.5 μm thick layer of polysilicon is deposited on the SiO₂ layer by well known chemical vapour deposition techniques. The polysilicon is etched with the pattern of lands and valleys using well-known photolithiographic techniques. Finally, the patterned polysilicon layer is oxidized by heating in an oxygen atmosphere to form the patterned layer of SiO₂. Upon oxidation, the polysilicon swells to nearly double its original thickness, resulting in lands about 1 μm high. In an alternative embodiment, the pattern of lands and valleys is formed directly in a layer of SiO₂ by partially etching the SiO₂ through a mask, using conventional photolithographic techniques.

After forming the pattern of lands and valleys in the SiO₂ layer, a layer of aluminum 20 approximately 1 μm thick (thicker or thinner films may also be employed) is deposited, for example by DC magnetron sputtering, on the SiO₂ layer 14 and is then patterned using standard etching techniques to define the thin metal structures of the device. Although the step height produced by the bas-relief pattern for providing stress relief is not critical and is envisioned to be on the same order of magnitude as the film thickness, the degree of stress relief required to reduce the hillock density to an acceptable level will depend upon the particular metal, the substrate, the metal thickness, and the temperature range to which the device must be subjected.

The exact dimensions of the bas-relief pattern that reduces the hillock density to an acceptable level can be easily determined by producing a series of test patterns and preparing a group of samples having different pattern sizes and step heights within a range of about an order of magnitude of the desired metal film thickness. The samples are coated with the metal film, and are then thermally cycled to simulate subsequent processing steps and the usage environments. The hillock density over each test pattern is then measured, for example with a profilmometer or electron microscope, and the dimensions of a pattern producing an acceptably low hillock density are chosen. Likewise, the pattern does not have to be a checkerboard pattern as shown in the example, other figures are envisioned to work as well as long as the pattern provides steps in both the width and length directions and the heights of the steps of the pattern are about the same order of magnitude as the thickness of film.

The bas-relief pattern may be provided over the entire surface of the thin film device, or may be provided only in the areas where patterned metal will reside after fabrication of the device.

The invention has been described with reference to a preferred embodiment thereof, however, it will be apparent that changes and modifications can be effected within the spirit and scope of the accompanying claims.

We claim:

1. A method of reducing hillock density in a thin film of metal having a high coefficient of thermal expansion on a substrate having a low coefficient of thermal expansion, comprising the steps of:
    forming for the purpose of reducing hillocks, a bas-relief pattern of lands and valleys, in an area of the substrate normally free from such pattern;
    forming on said pattern a thin film of metal having a high coefficient of thermal expansion, the height and depth dimensions of said lands and valleys being of the same order of magnitude as the thickness of said metal film, whereby stress relief is provided by said bas-relief pattern thereby reducing hillock formation in said metal film.

2. The invention claimed in claim 1, wherein said substrate is silicon and silicon dioxide, and wherein said metal is aluminum.

3. The invention claimed in claim 2, wherein said aluminum is approximately 1 μm thick, wherein said lands and valleys form a checkerboard pattern, said valleys being approximately 1 μm deep and said pattern being approximately 5 μm × 5 μm.

4. A thin film structure comprising:
    a substrate having a low coefficient of thermal expansion, a portion of said substrate defining a bas-relief pattern of lands and valleys, in an area normally free from such pattern, for the purpose of reducing hillock density in a film of metal overlying said portion of said substrate; and
    a thin film of metal over said pattern on said portion of said substrate, having a high coefficient of thermal expansion, the height and depth dimensions of said pattern of lands and valleys being of the same order of magnitude as the thickness of said metal film, whereby stress relief is provided by said bas-relief pattern, thereby reducing hillock formation in said metal film.

5. The invention claimed in claim 4, wherein said substrate is silicon and silicon dioxide, and wherein said metal is aluminum.

6. The invention claimed in claim 5, wherein said aluminium is approximately 1 μm thick, wherein said bas-relief pattern is a checkerboard pattern, said valleys being approximately 1 μm deep and the squares of said checkerboard being approximately 5 μm square.

7. A method of reducing hillock density in a thin film of metal having a high coefficient of thermal expansion on a substrate having a low coefficient of thermal expansion, comprising the steps of:
    forming a bas-relief pattern of lands and valleys on said substrate, in an area normally free from such pattern, for the purpose of reducing hillock density, the dimensions of said bas-relief pattern being of size and depth sufficient to reduce hillock density in an overlying film of metal to an acceptable level;
    forming a thin film of metal over said bas-relief pattern.

8. The invention claimed in claim 1, wherein said substrate is silicon dioxide, and said bas-relief pattern is formed by:
    depositing a layer of polysilicon on said substrate;
    patterning said layer of polysilicon; and
    oxidizing said patterned layer of polysilicon to form a patterned layer of silicon dioxide.

* * * * *